United States Patent
Mizutani et al.

(10) Patent No.: US 9,711,363 B2
(45) Date of Patent: Jul. 18, 2017

(54) PLATING METHOD, RECORDING MEDIUM AND PLATING SYSTEM

(71) Applicant: Tokyo Electron Limited, Tokyo (JP)

(72) Inventors: Nobutaka Mizutani, Nirasaki (JP); Mitsuaki Iwashita, Nirasaki (JP); Takashi Tanaka, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 15/098,624

(22) Filed: Apr. 14, 2016

(65) Prior Publication Data
US 2016/0307759 A1    Oct. 20, 2016

(30) Foreign Application Priority Data
Apr. 16, 2015 (JP) ................. 2015-084434

(51) Int. Cl.
| | |
|---|---|
| H01L 21/288 | (2006.01) |
| H01L 21/445 | (2006.01) |
| H01L 21/768 | (2006.01) |
| C23C 18/18 | (2006.01) |
| C23C 18/31 | (2006.01) |
| H01L 21/311 | (2006.01) |
| H01L 23/532 | (2006.01) |
| H01L 21/02 | (2006.01) |
| C23C 18/16 | (2006.01) |
| C23C 18/32 | (2006.01) |

(52) U.S. Cl.
CPC ........ H01L 21/288 (2013.01); C23C 18/1608 (2013.01); C23C 18/1886 (2013.01); C23C 18/1889 (2013.01); C23C 18/31 (2013.01); C23C 18/32 (2013.01); H01L 21/02063 (2013.01); H01L 21/02068 (2013.01); H01L 21/76865 (2013.01); H01L 21/76874 (2013.01); H01L 21/76879 (2013.01); H01L 23/53209 (2013.01); *H01L 21/31133* (2013.01)

(58) Field of Classification Search
None
See application file for complete search history.

(56) References Cited

U.S. PATENT DOCUMENTS 5,510,216 A * 4/1996 Calabrese ................ G03F 7/40
430/11

FOREIGN PATENT DOCUMENTS

JP    2010-185113 A    8/2010

* cited by examiner

*Primary Examiner* — Lisha Jiang
(74) *Attorney, Agent, or Firm* — Pearne & Gordon LLP

(57) ABSTRACT

A plating method includes forming a catalyst layer 118 on a surface of a substrate including an inner surface of a recess 112; drying the substrate having the catalyst layer formed thereon such that an inside of the recess is dried as well; removing the catalyst layer at least on the surface of the substrate at the outside of the recess by supplying a processing liquid, which is configured to dissolve a material of the surface of the substrate, onto the surface of the substrate while rotating the dried substrate and while preventing or suppressing the processing liquid from being introduced into the dried inside of the recess; and forming a plating layer 119 on the inside of the recess, at which the catalyst layer is not removed, by an electroless plating process.

6 Claims, 4 Drawing Sheets

PLATING METHOD, RECORDING MEDIUM AND PLATING SYSTEM

CROSS-REFERENCE TO RELATED APPLICATION

This application claims the benefit of Japanese Patent Application 2015-084434 filed on Apr. 16, 2015, the entire disclosures of which are incorporated herein by reference.

TECHNICAL FIELD

The embodiments described herein pertain generally to a technique of forming a plating film selectively within a recess formed on a surface of a substrate such as a semiconductor wafer.

BACKGROUND

A wiring within a semiconductor device such as an LSI is formed by burying a wiring material within a recess, which is formed on an insulating layer on a substrate such as a semiconductor wafer, by using a plating technique. Currently, the most widely used wiring material is Cu. A Cu wiring layer is formed by forming, within the recess, a barrier layer for suppressing diffusion of Cu, forming a seed layer on the barrier layer by electroless Cu plating and forming a wiring layer by electrolytic plating (see, for example, Patent Document 1).

However, a void may be formed in the Cu wiring layer which is formed by the aforementioned method. Further, recently, as the wiring layer is getting ever more miniaturized, a volume occupied by the barrier layer becomes non-negligible. That is, if a ratio of the volume of the barrier layer having high electric resistance with respect to the total volume prepared for forming the wiring layer increases, it is difficult to obtain a sufficiently low resistance value. Furthermore, the number of processes required to form the Cu wiring layer is too many, so that a manufacturing cost of the semiconductor device is increased.

As one approach to solve the aforementioned problem, it is being considered to use a Ni-based metal as the wiring material instead of Cu. Since the Ni-based metal is not diffused into a silicon compound which is used for forming the insulating layer, a barrier layer need not be formed separately from the wiring layer. Thus, by using the Ni-based metal wiring layer, the volume of the wiring layer can be increased, and, depending on conditions, electric resistance as low as or even lower than the electric resistance of the Cu wiring layer can be achieved. Furthermore, in case of using the Ni-based metal, a relatively high precipitation rate and a relatively high plating quality are obtained by the electroless plating method. Besides, by using the Ni-based metal, processes of forming the barrier layer and the seed layer can be omitted, so that the manufacturing cost of the semiconductor device can be reduced.

When performing the electroless plating of the Ni-based metal, if a catalyst layer serving as a catalyst of a reductive precipitation reaction is formed on an outer surface of the substrate as well as within the recess, a plating layer may be formed even on the outer surface of the substrate. This extra plating layer needs to be removed by chemical mechanical polishing (CMP). In order to cut the manufacturing cost of the semiconductor device, this CMP processing time needs to be reduced.

Patent Document 1: Japanese Patent Laid-open Publication No. 2010-185113

SUMMARY

In view of the foregoing, exemplary embodiments provide a technique capable of forming a plating layer selectively within a recess formed on a surface of a substrate.

In one exemplary embodiment, a plating method includes preparing a substrate having a recess formed on a surface thereof; forming a catalyst layer on the surface of the substrate including an inner surface of the recess; drying the substrate having the catalyst layer formed thereon such that an inside of the recess is dried as well; removing the catalyst layer at least on the surface of the substrate at the outside of the recess by supplying a processing liquid, which is configured to dissolve a material of the surface of the substrate, onto the surface of the dried substrate while rotating the dried substrate and while preventing or suppressing the processing liquid from being introduced into the dried inside of the recess; and forming a plating layer on the inside of the recess, at which the catalyst layer is not removed, by an electroless plating process.

In another exemplary embodiment, there is provided a computer-readable recording medium having stored thereon computer executable instructions that, in response to execution, cause a plating system to perform the plating method.

In still another exemplary embodiment, a plating system includes a first pre-treatment unit configured to form a catalyst layer on a surface of a substrate, which has a recess on the surface thereof, including an inner surface of the recess and configured to dry the substrate having the catalyst layer formed thereon such that an inside of the recess is dried as well; a second pre-treatment unit configured to remove the catalyst layer at least on the surface of the substrate at the outside of the recess by supplying a processing liquid, which is configured to dissolve a material of the surface of the substrate, onto the surface of the substrate while rotating the dried substrate and while preventing or suppressing the processing liquid from being introduced into the dried inside of the recess; and a plating unit configured to form a plating layer on the inside of the recess, at which the catalyst layer is not removed, by an electroless plating process.

According to the exemplary embodiments, it is possible to form the catalyst layer at the inside of the recess without forming the catalyst layer on the surface of the substrate at the outside of the recess. Therefore, in the plating process, the plating layer may not be formed at the outside of the recess, or, if formed, the amount of the plating layer formed at the outside of the recess can be minimized.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

Figure 1:
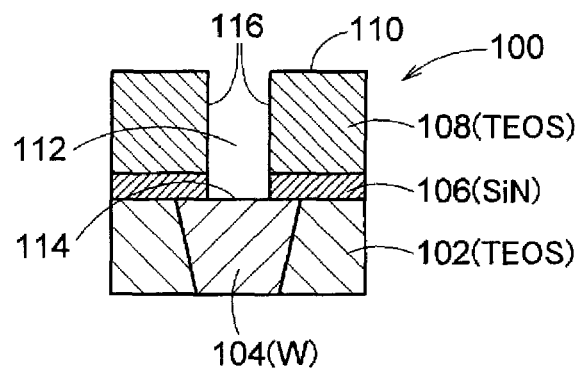
FIG. 1 is a cross sectional view illustrating an example of a cross section of a substrate which is processed by a plating method according to an exemplary embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

First, a structure of a substrate 100 to be processed by a plating method to be described later will be explained with reference to FIG. 1. The substrate 100 includes a multiple number of layers formed on a silicon wafer as a base, which is not shown in FIG. 1. These multiple number of layers include, as depicted in FIG. 1, a TEOS (tetraethoxysilane) layer 102, a W (tungsten) wiring layer 104 buried in the TEOS layer 102, a SiN (silicon nitride) layer 106 deposited on the TEOS layer 102, and a TEOS layer 108 formed on the SiN layer 106. Though there is still another layer under the TEOS layer 102, that layer is not illustrated in FIG. 1.

A surface of the TEOS layer 108 forms a surface 110 of the substrate 100. The surface 110 is provided with a recess 112 to be filled with a Ni-based wiring material to be described later. The recess 112 is formed through the TEOS layer 108 and the SiN layer 106, and reaches the W wiring layer 104. Accordingly, a bottom surface 114 of the recess 112 is made of W (tungsten), and a side surface 116 of the recess 112 is made of TEOS and SiN. The recess 112 has a width ranging from, for example, 40 nm to 60 nm. Since a manufacturing method of the substrate 100 having this stacked structure is commonly known to those skilled in the art, description thereof will be omitted herein.

Figure 4:
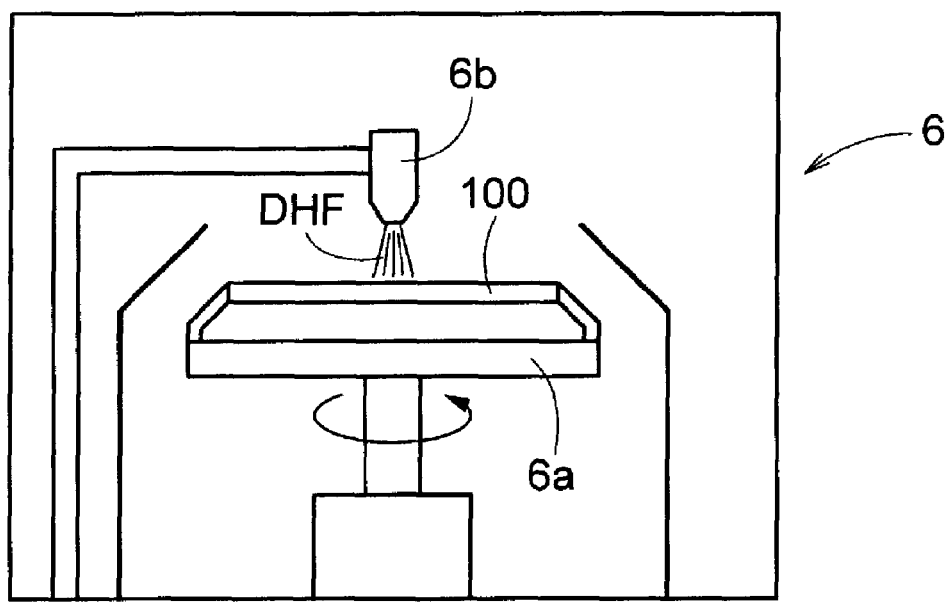
FIG. 4 is a schematic diagram illustrating a configuration of a catalyst layer removing unit.
Figure 5:
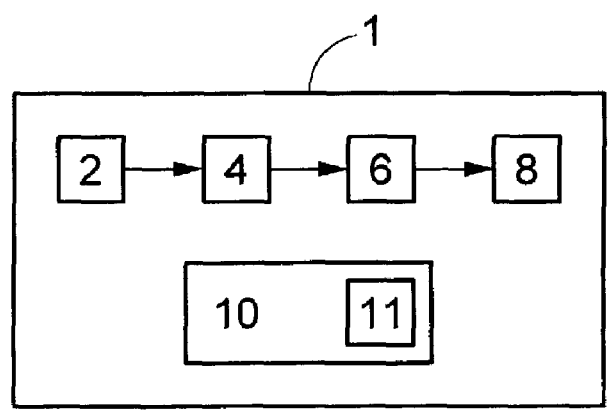
FIG. 5 is a schematic diagram illustrating a configuration of a plating system.

Now, referring to FIG. 2A to FIG. 4, a sequence of a process of filling the recess 112 by NiB plating will be described. A processing unit used in this process is schematically illustrated in FIG. 4 and FIG. 5.

First, the substrate 100 is carried into a pre-cleaning unit 2, and a pre-wet process of creating a state in which a liquid can easily enter the recess 112 by supplying DIW (pure water) and IPA (isopropyl alcohol) onto the substrate 100 is performed (process S201). At the final stage of the pre-wet process, the DIW is supplied onto the substrate 100, so that the surface 110 of the substrate 100 and the inside of the recess 112 are wet with the DIW.

Subsequently, the substrate 100 is cleaned by using a TMAH (tetramethylammonium hydroxide) solution as an alkaline cleaning solution (process S202). The main purpose of this cleaning process is to remove an oxide film on the W surface exposed on the bottom surface 114 of the recess 112 and, also, to remove an organic residue on the surface of the TEOS layer 108 forming the side surface 116 of the recess 112 and the surface 110 of the substrate 100.

Then, the TMAH and the residue remaining on the substrate 100 are removed by supplying a rinse liquid (e.g., DIW) onto the substrate 100, and the rinse liquid on the substrate 100 is substituted with the IPA by supplying the IPA onto the substrate 100. Thereafter, the substrate is dried (process S203). To dry the substrate completely, the substrate may be dried by baking.

Figure 2A:
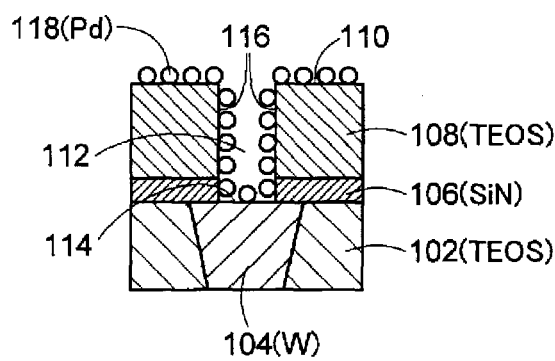
FIG. 2A to FIG. 2C provide schematic cross sectional views for describing a process performed on the substrate shown in FIG. 1.

Thereafter, the substrate 100 is carried out of the pre-cleaning unit 2 and then carried into a catalyst layer forming unit 4 by a non-illustrated substrate transfer device. In the catalyst layer forming unit 4, an alkaline palladium catalyst solution (for example, a solution prepared by dispersing ionized palladium nanaoparticles in an alkaline dispersion medium) serving as a catalyst solution for forming a catalyst layer is supplied onto the substrate 100, so that a palladium catalyst layer 118 is formed on the surface 110 of the substrate 100 (that is, the surface 110 of the substrate at the outside of the recess 112) and the bottom surface 114 and the side surface 116 within the recess 112, as illustrated in FIG. 2A (process S401). Prior to performing the process S401, the same pre-wet process as the process S201 may be performed.

Subsequently, the rinse process is performed by supplying the rinse liquid (for example, DIW) onto the substrate 100, so that the palladium catalyst solution and a residue remaining on the substrate 100 are removed.

Afterwards, DMAB (dimethylamine borane) as a reducing agent, for example is supplied onto the substrate 100, so that palladium ions in the palladium catalyst layer 118 are reduced into metal palladium (process S402). If palladium remains in positive ion ($Pd^{2+}$), the palladium ions once separated from the substrate 100 when performing a process S601 to be described later may strongly remain on the surface 110 of the TEOS layer 108, so that it is difficult to lift off the palladium ions when dissolving a surface portion of the TEOS layer 108 by DHF of low-concentration. In view of this, it is desirable that the palladium is turned into the metal palladium.

Subsequently, the DMAB and a residue remaining on the substrate 100 are removed by supplying the rinse liquid (e.g., DIW) onto the substrate 100, and the rinse liquid on the substrate 100 is then substituted with the IPA by supplying the IPA onto the substrate 100. Thereafter, the substrate 100 is dried (process S403). Through this drying process, no liquid is left within the recess 112, and the inside of the recess 112 is filled with an ambient atmosphere (a gas, e.g., clean air) around the substrate 100. To dry the substrate completely, the substrate may be dried by baking.

Then, the substrate 100 is carried out of the catalyst layer forming unit 4 and then is carried into a catalyst layer removing unit 6 shown in FIG. 4 by a non-illustrated substrate transfer device. In the catalyst layer removing unit 6, the substrate is horizontally held on a spin chuck 6a and rotated about a vertical axis thereof. In this state, DHF (dilute hydrofluoric acid) having a concentration of, e.g., 0.01% to 0.1% is supplied onto a central portion of the surface 110 of the substrate 100 as a catalyst layer removing liquid from a chemical liquid nozzle 6b. As a result, the palladium catalyst layer 118 containing the metal palladium particles on the substrate 100 is removed (process S601). Here, it is not that the palladium catalyst layer 118 is removed by dissolving the palladium catalyst layer 118 itself but that the palladium catalyst layer 118 is removed by dissolving the surface portion of the TEOS layer 108 to which the palladium catalyst layer 118 is attached.

At this time, since the inside of the recess 112 is filled with the ambient atmosphere (for example, air) around the substrate 100 and the width of the recess 112 is very small within the range from, e.g., 40 nm to 60 nm, the DHF cannot easily enter the recess 112. Further, by setting a rotational speed of the substrate 100 to be of a relatively high appropriate value (e.g., 800 rpm to 1000 rpm) and by setting a DHF supplying time to be of a relatively short appropriate value (e.g., 10 sec to 30 sec) (the rotational speed and the DHF supplying time can be determined by experiments), it becomes more difficult for the DHF to enter the recess 112.

Figure 2C:
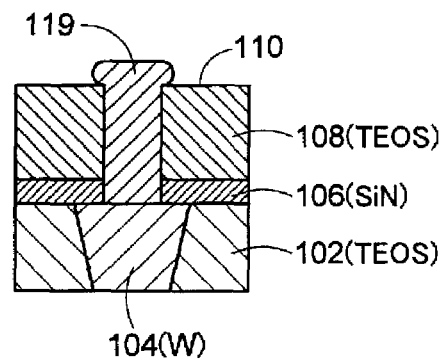
Figure 2B:
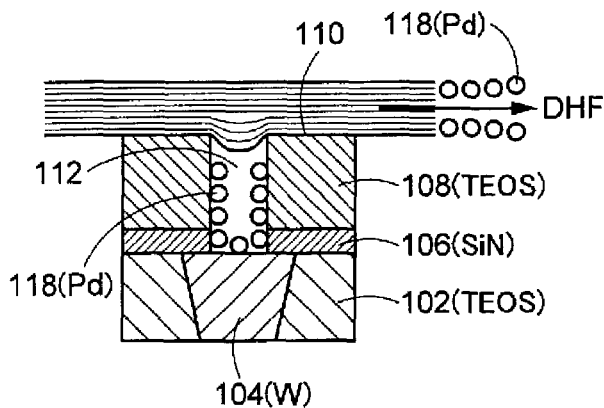
Figure 3:
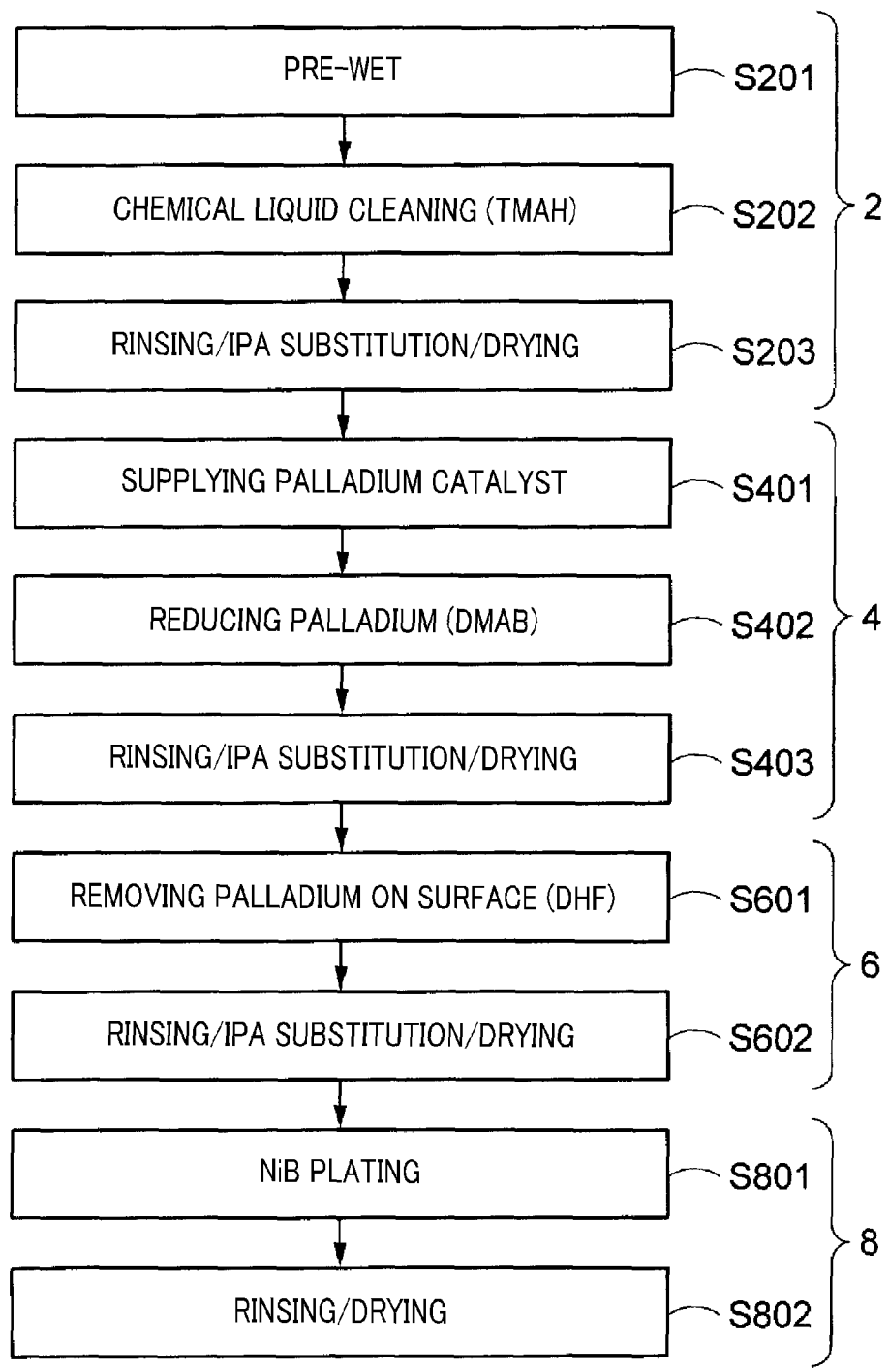
FIG. 3 is a flowchart for describing a processing sequence of the process performed on the substrate shown in FIG. 1.

That is, as illustrated in FIG. 2B, the DHF which flows outwards on the surface of the substrate 100 by a centrifugal force can only reach the vicinity of a top opening of the recess 112. Accordingly, though the palladium catalyst layer 118 in contact with the DHF is removed, the palladium catalyst layer 118 not in contact with the DHF, that is, the palladium catalyst layer 118 at the bottom surface 114 of the recess 112 and at a portion of the side surface 116 close to the bottom surface 114 is not removed.

Furthermore, as can be clearly understood from the above description, immediately before the DHF is supplied onto the substrate 100, the inside of the recess 112 needs to be maintained filled with the gas. Thus, it is desirable that the pre-wet process such as the process S201 is not performed prior to conducting the process S601.

Subsequently, upon the completion of the process S601, the rinse process is immediately performed by supplying the rinse liquid (for example, DIW) onto the substrate 100, so that the DHF and a residue remaining on the substrate 100 are removed. Thereafter, by supplying the IPA onto the substrate 100, the rinse liquid on the substrate 100 is substituted with the IPA, and, then, the substrate is dried (process S602).

Thereafter, the substrate 100 is carried out of the catalyst layer removing unit 6 and is carried into a plating unit 8 by a non-illustrated substrate transfer device. In the plating unit 8, by supplying a plating liquid onto the substrate 100, an electroless plating process is performed (process S801). Prior to performing the process S801, the same pre-wet process as the process S201 may be performed.

Since the palladium catalyst layer 118 remains within the recess 112 as described above, a NiB plating layer (plating film) 119 grows upwards (so-called bottom-up) from the vicinity of the bottom surface 114 of the recess 112. The NiB plating layer is not formed on the surface 110 of the substrate 100 where the palladium catalyst layer 118 is removed. If the plating process is finished, the inside of the recess 112 is completely filled with the NiB plating layer 119, and the NiB plating layer 119 is slightly protruded from the top opening of the recess 112, as illustrated in FIG. 2C.

Upon the completion of the plating process, the rinse process is performed by supplying the rinse liquid (for example, DIW) onto the substrate 100, and, the substrate 100 is dried (process S802). Then, the plating process is ended. The NiB plating layer 119 grown at the outside of the recess 112 during the above-described electroless plating process is removed by the CMP or the like.

According to the above-described exemplary embodiment, when performing the partial removing process of the catalyst layer (process S601), prior to the process S601, the substrate 100 is dried and the inside of the recess 112 is filled with the gas (e.g., air), not a liquid. In this state, by rotating the substrate 100, the catalyst layer removing liquid (DHF) flows on the substrate 100 from the central portion of the substrate 100 toward the peripheral portion thereof. Accordingly, the palladium catalyst layer 118 can be removed from the surface 110 of the substrate 100 at the outside of the recess 112 whereas the palladium catalyst layer 118 within the recess 112 is not removed. Further, since the partial removing process of the palladium catalyst layer 118 can be performed by using an apparatus which is widely utilized in the field of semiconductor wafer cleaning, an increase of an apparatus cost and a manufacturing cost caused by performing the above-described method can be minimized.

By removing the palladium catalyst layer 118 from the surface 110 of the substrate 100 at the outside of the recess 112, the NiB plating layer 119 does not grow from the surface 110. Even if there exists the NiB plating layer 119 on the surface 110 after the NiB plating process, it is just an extra portion of the NiB plating layer 119 protruded from the recess 112, and this extra portion of the NiB plating layer 119 only exists in the vicinity of the recess 112. Accordingly, even when it is required to remove the extra NiB plating layer by the CMP, the CMP processing time can be shortened greatly. That is, according to the exemplary embodiment, it is possible to bury the NiB plating layer within the recess 112 surely while suppressing the increase of the manufacturing cost and the total processing time. Furthermore, since the NiB plating is not performed on the surface 110, peeling of the plating film may not occur during the CMP process. For the advantages of the Ni-based wiring layer in comparison with the Cu wiring layer, please refer to the description of Technical Field.

Further, if it is possible to stop the growth of the plating film in the vicinity of the top opening of the recess 112 by controlling the plating conditions precisely, the CMP process may be omitted.

In the above-described exemplary embodiment, by flowing the DHF onto the surface 110 of the substrate 100 at a relatively high flow velocity while maintaining the inside of the recess 112 filled with the gas, introduction of the DHF into the recess 112 can be suppressed. As can be clearly seen from this principle, if the width of the recess 112 increases, it becomes more difficult to suppress the introduction of the DHF. Meanwhile, through experiments by the present inventors, it is known that an upper limit of the width of the recess 112, in which the above-described method can be effectively performed, is several hundreds of nanometers (nm) in case that the material of the surface 110 of the substrate 100 is TEOS and the catalyst layer removing liquid is DHF. Since, however, the easiness (probability) of the introduction of the catalyst layer removing liquid into the recess 112 varies depending on the material of the surface 110 of the substrate 100, a surface tension and a viscosity of the catalyst layer removing liquid, and so forth, the upper limit of the width of the recess 112, in the above-described method is effectively performed, may not always be several hundreds of nanometers.

Each of the pre-cleaning unit 2, the catalyst layer forming unit 4 and the plating unit 8 used in the present exemplary embodiment may be implemented by a single-wafer type spin liquid processing unit having the same configuration as that of the catalyst layer removing unit 6 shown in FIG. 4. In these units 2, 4 and 8 as well, by supplying a necessary processing liquid (cleaning liquid, reducing agent, rinse liquid (DIW, etc.), IPA, plating liquid, etc.) onto the surface of the substrate 100 from a nozzle while rotating the substrate at an appropriate rotational speed (including 0 rpm) for each process, a required liquid process is performed on the substrate with the processing liquid that covers the surface of the substrate.

The liquid processing units (pre-cleaning unit 2, catalyst layer forming unit 4 and plating unit 8) except the catalyst layer removing unit 6 may be implemented by a batch type liquid processing unit configured to perform a liquid process on a plurality of substrates by submerging the substrates in a processing liquid in a processing vessel.

The aforementioned pre-cleaning unit 2, the catalyst layer forming unit 4, the catalyst layer removing unit 6 and the plating unit 8 may constitute the integrated plating system 1 by being accommodated in a single casing. A transfer of the substrate 100 between the respective processing units is performed by a non-illustrated transfer device within the system. An overall operation of the plating system 1 is controlled by the controller 10 according to various kinds of programs recorded on the recording medium 11 provided in the controller 10, so that the above-described respective processes are performed. The recording medium 11 stores thereon various kinds of programs such as a control program and processing recipes required to perform the above-described series of processes. The recording medium 11 may be implemented by, but not limited to, a computer-readable memory device such as a ROM or a RAM, or a disk-type recording medium such as a hard disk, a CD-ROM, a DVD-ROM or a flexible disk, as commonly known in the art.

The liquid processing units 2, 4, 6 and 8 may be independently provided at separate positions apart from each other. Even in this case, the liquid processing units 2, 4, 6 and 8 still constitute the plating system 1. In this configuration, the controller and the recording medium for controlling the operations of the liquid processing units 2, 4, 6 and 8 may be implemented by a host computer provided in a semiconductor device manufacturing factory and a recording medium provided in this host computer. Furthermore, since the pre-cleaning unit 2 and the catalyst layer removing unit 6 are general-purpose cleaning units that can be used for other purposes, they may be implemented by one provided in a cleaning system provided in the semiconductor device manufacturing factory.

At least two of the four liquid processing units 2, 4, 6 and 8 may be combined. For example, one of the pre-cleaning unit 2 and the catalyst layer forming unit 4 may be omitted, and the catalyst layer forming unit 4, for example, may be configured to have a function of the pre-cleaning unit 2 as well. In such a case, the catalyst layer forming unit 4 is implemented by a single-wafer type spin liquid processing unit having the same configuration as that of the catalyst layer removing unit 6, and is equipped with a multiple number of nozzles for supplying the cleaning liquid, the rinse liquid (DIW, etc.), the IPA and the catalyst solution onto the substrate 100, respectively. Further, in case of combining the processing units, some of the processes can be omitted. For example, the IPA substitution process and the drying process performed before the substrate 100 is carried from the pre-cleaning unit 2 toward the catalyst layer forming unit 4 can be omitted, so that the catalyst solution can be supplied to the substrate 100 immediately after the rinse process.

The catalyst contained in the catalyst layer is not limited to palladium, and another metal, such as gold (Au), platinum (Pt) or ruthenium (Ru), having a function as a catalyst for reductive precipitation reaction in the electroless plating can be used instead. Further, the catalyst layer may be formed through a series of processes of forming a SAM by supplying an appropriate coupling agent such as a silane coupling agent or a titanium coupling agent onto the substrate; supplying a catalyst ion-containing liquid such as palladium chloride solution onto the substrate; and then supplying a reducing agent such as DMAB onto the substrate. That is, in the process S401, any catalyst solution capable of serving as a catalyst for reductive precipitation reaction in a plating process can be used, and it is possible to form the catalyst layer by using a commonly known method in the pertinent art.

The material buried by the electroless plating process is not limited to NiB. For example, another Ni-based material such as Ni or NiP or another metal material such as Co, CoB or CoP may be used.

The chemical liquid used in the chemical liquid cleaning process (process S202) is not limited to TMAH. That is, depending on a material of a surface onto which the palladium catalyst is attached, an appropriate chemical liquid may be used.

As the rinse liquid used in the above-described respective processes, it is possible to use, instead of the DIW, a liquid prepared by dissolving, ions, e.g., carbonic acid, which have conductivity, into the pure water, from the point of view of electrostatic destruction prevention.

On the substrate 100 having the structure of the cross section shown in FIG. 1, the TEOS layer 102 may be replaced by a $SiO_2$ layer, and the SiN layer 106 may be replaced by a SiCN layer or a SiC layer. Further, the TEOS layer 108 may be replaced by a $SiO_2$ layer or a SiOC layer. Even in case that the uppermost layer (i.e., the layer forming the surface 110 of the substrate 100) is a $SiO_2$ layer or a SiOC layer, it is possible to use DHF, which is capable of dissolving these layers, as the catalyst layer removing liquid.

Under the condition that a processing target object has a recess on a surface thereof and a plating process for filling the recess is performed after a catalyst layer is formed, if there is a demand for suppressing a plating layer from being formed at the outside of the recess, the processing target object may not be limited to the substrate 100 as described above.

Figure 6A:
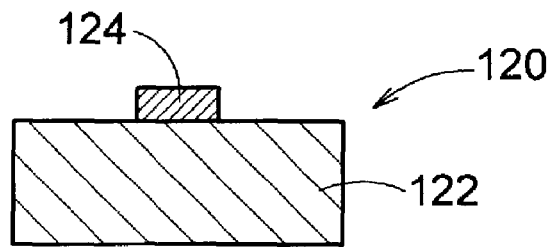
FIG. 6A to FIG. 6C provide cross sectional views of a processing target substrate to describe a plating method according to another exemplary embodiment.

That is, the uppermost layer on the substrate may not be limited to the aforementioned silicon-oxide-based material (TEOS, $SiO_2$, SiOC, etc.), but may be an organic film such as, but not limited to, a resist film. As schematically depicted in FIG. 6A, it is assumed that a metal hard mask 124 is formed on an etching target layer 122 (a material of which is not particularly limited) on a substrate 120 by a plating process. In this case, a resist film (resist pattern) 126 having a recess 126b on a surface 126a thereof is formed on the substrate 120 by the photolithography technique in advance. The etching target layer 122 is exposed on a bottom portion of the recess 126b.

Figure 6B:
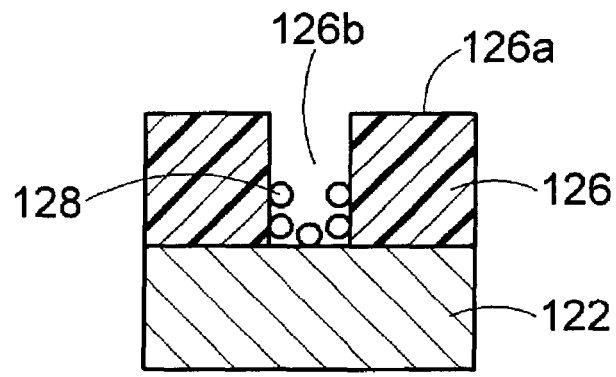

First, after performing the pre-cleaning process, the pre-wet process, and so forth on the substrate 120 as required, the same processes as the above-described processes S401 to S403 are performed, and, then, the same processes as the above-described processes S601 to S602 are performed. As a result, a palladium catalyst layer 128 is formed only within the recess 126b, desirably, only in the vicinity of the bottom portion of the recess 126b, as illustrated in FIG. 6B. Here, as a liquid for removing the palladium catalyst layer that is left on the surface 126a, an organic solvent capable of dissolving the resist film is used instead of DHF. Accordingly, the palladium catalyst layer 128 that is left on the surface 126a can be removed together with a surface portion of the resist film 126.

Figure 6C:
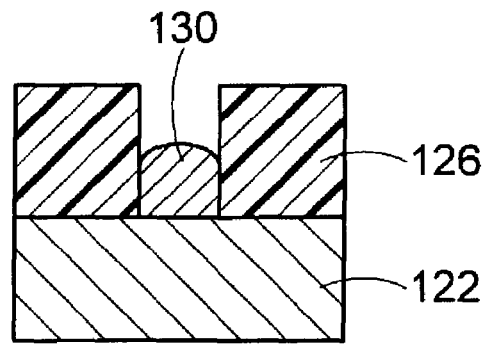

Thereafter, as depicted in FIG. 6C, the electroless plating process is performed, and the inside of the recess 126b is filled with a plating layer 130 by the bottom-up. At this time, the plating layer 130 need not be formed in the entire portion of the inside of the recess 126b, but the plating layer 130 may only need to be formed in the vicinity of the bottom portion of the recess 126b. Upon the completion of the plating process, the entire resist film is dissolved by the organic solvent, so that a structure as illustrated in FIG. 6A is obtained.

In this case, if the plating layer 130 is formed on the surface 126a of the resist film 126 at the outside of the recess 126b, it is difficult or takes a long time to remove the resist film 126 later. According to the method of the exemplary embodiment, however, such a problem can be suppressed.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A plating method comprising:
preparing a substrate having a recess formed on a surface thereof;
forming a catalyst layer on the surface of the substrate including an inner surface of the recess;
drying the substrate having the catalyst layer formed thereon such that an inside of the recess is dried as well;
removing the catalyst layer at least on the surface of the substrate at the outside of the recess by supplying a processing liquid, which is configured to dissolve a material of the surface of the substrate, onto the surface of the substrate while rotating the dried substrate and while preventing or suppressing the processing liquid from being introduced into the dried inside of the recess; and
forming a plating layer on the inside of the recess, at which the catalyst layer is not removed, by an electroless plating process.

2. The plating method of claim 1,
wherein the forming of the catalyst layer comprises:
attaching a metal catalyst ion to the surface of the substrate by supplying a catalyst solution containing the metal catalyst ion onto the substrate; and
reducing the metal catalyst ion into a metal.

3. The plating method of claim 2,
wherein the metal is palladium.

4. The plating method of claim 1,
wherein the plating layer is made of NiB.

5. The plating method of claim 1,
wherein the processing liquid is dilute hydrofluoric acid, and
the material of the surface of the substrate is silicon or a silicon compound allowed to be dissolved by the dilute hydrofluoric acid.

6. The plating method of claim 1,
wherein the material of the surface of the substrate is a resist, and
the processing liquid is a solvent configured to dissolve the resist.

* * * * *